(12) United States Patent
Itten et al.

(10) Patent No.: US 8,310,242 B2
(45) Date of Patent: Nov. 13, 2012

(54) CIRCUIT ARRANGEMENT AND METHOD FOR INSULATION MONITORING FOR INVERTER APPLICATIONS

(75) Inventors: Alex Itten, Romanshorn (CH); Peter Thür, Frauenfeld (CH)

(73) Assignee: Schmidhauser AG, Romanshorn (CH)

( * ) Notice: Subject to any disclaimer, the term of this patent is extended or adjusted under 35 U.S.C. 154(b) by 765 days.

(21) Appl. No.: 11/867,687

(22) Filed: Oct. 5, 2007

(65) Prior Publication Data

US 2008/0084215 A1    Apr. 10, 2008

(30) Foreign Application Priority Data

Oct. 6, 2006   (CH) ........................ 1602/06

(51) Int. Cl.
*G01R 31/14*   (2006.01)
(52) U.S. Cl. ....................................... 324/509
(58) Field of Classification Search ............ 324/509
See application file for complete search history.

(56) References Cited

U.S. PATENT DOCUMENTS

| | | | |
|---|---|---|---|
| 5,214,575 A | 5/1993 | Sugishima et al. | |
| 5,686,839 A | 11/1997 | Takagi | |
| 5,760,488 A | 6/1998 | Sonntag | |
| 5,818,236 A * | 10/1998 | Sone et al. | 324/509 |
| 5,877,606 A * | 3/1999 | Nozari | 318/700 |
| 6,291,987 B1 * | 9/2001 | Dean et al. | 324/764.01 |
| 6,856,137 B2 | 2/2005 | Roden et al. | |
| 6,900,643 B2 * | 5/2005 | Deng et al. | 324/522 |
| 7,079,964 B2 * | 7/2006 | Gerlach | 702/76 |
| 7,327,545 B2 * | 2/2008 | Konishi | 361/93.1 |
| 2006/0158197 A1 * | 7/2006 | Horikoshi et al. | 324/551 |

FOREIGN PATENT DOCUMENTS

| | | |
|---|---|---|
| DE | 4203299 | 8/1993 |
| DE | 4339946 | 6/1995 |
| DE | 10106200 | 9/2002 |
| EP | 075139 | 1/1997 |
| JP | 2000116144 | 4/2000 |

\* cited by examiner

*Primary Examiner* — Jeff Natalini
(74) *Attorney, Agent, or Firm* — Oppedahl Patent Law Firm LLC

(57) ABSTRACT

An inverter application comprises at least one apparatus fed by an inverter (10). The determining of insulation defects is effected by way of a differential voltage of part voltages (U, U') of an intermediate circuit (7) or the ratio of one of these part voltages (U, U') to the total voltage of an intermediate circuit, and by way of an operating condition of the inverter (10). The monitoring of the insulation is carried out only with the means (1a, 1b, 1c, 1a', 1b', 1c', 5, 5') which are present in the inverter (10) in any case. The operating condition is set as a particular switch position in the inverter (10) by an insulation monitoring system. Alternatively, the operating condition is, while the inverter is on-line or in operation, transferred from the inverter control (9) to an insulation monitoring system for improving the quality of the monitoring.

17 Claims, 3 Drawing Sheets

CIRCUIT ARRANGEMENT AND METHOD FOR INSULATION MONITORING FOR INVERTER APPLICATIONS

The invention relates to the field of power electronics. It relates in particular to a method and to a device for insulation monitoring for inverter applications.

BACKGROUND

In an IT-system (French Isolé Terre) or an IT-network, conductive housings of the devices are earthed, but not the star point of a feeding transformer. Thus (with small networks), no dangerous touch voltage occurs given an insulation fault between a conductor of the network and the housing or earth. An insulation monitoring must detect this first fault, before a second, potentially dangerous fault occurs.

With IT-networks with electrical (clocked) drives, fault currents arise due to the relocation of charge carriers in the cable and motor capacitances, and these fault currents behave similarly to fault currents that are due to insulation defects. Conventional insulation testing apparatus are interfered with on account of this, which leads to misleading error messages with regard to the condition of the insulation. The setting of the warning limits and the fault limits is rendered more difficult and partly rendered impossible, due to the dependency of these capacitive fault currents on the number of drives, their momentary operating conditions, and on the manner in which the cables are laid. Making this more difficult is also the fact that these capacitive fault currents may change on account of the aging of the insulation, dirt and humidity, so that warning limits and fault limits which were once set in an optimal manner, must also be reset later, in order to avoid misleading error messages.

Insulation monitoring apparatus must themselves periodically monitor their own manner of functioning. As a rule, additional circuit parts are incorporated for this, which in the case of a fault, may themselves lead to a loss of insulation, which increases the failure rate of the complete system.

Insulation defects may occur everywhere in the system, and are therefore difficult to localise. In complex installations, this leads to very high costs for fault correction, e.g. in that the wrong components are repeatedly exchanged, since the exact defect cause may not be determined in the field. Likewise, during maintenance work, on account of a sporadically occurring increase and reduction of the capacitive fault currents, insulation damage which is indeed present may not be recognised, or only too late, since the fault diagnosis may only be carried out in a very imprecise manner.

An arrangement is presented in DE 42 03 299 A1, which uses a part of the measurement circuit present in the electrical drives (inverter devices) for the measurement of the DC voltage in the intermediate circuit, for monitoring the insulation. There, this method is applied for applications in housings encapsulated in a pressure-tight manner, wherein the monitoring limit values are achieved by setting resistance values, and the suppression of the capacitive fault currents produced by the switching of the drives is achieved by low-pass filtering. This method has the disadvantages mentioned in the introduction, and cannot determine the location of the insulation error.

DE 43 39 946 A1 and DE 101 06 200 C1 show insulation monitoring by way of injecting a measurement voltage via an ohmic measurement circuit. The measurement voltage is produced by a special generating circuit.

DE 696 24 409 T2 shows insulation monitoring with electrical vehicles, with which a measurement alternating voltage is fed into the network capacitively and the current which is fed in this manner is measured.

DE 195 03 749 C1 describes a measurement bridge for determining an asymmetry in the on-board network of an electric vehicle, which detects a shifting of the positive or the negative feed voltage.

EP 0 490 388 discloses a fault current detector for an inverter, which by way of shunt resistors, measures the current through each of the half-bridges, and signalizes an earth fault in the case that an excess current occurs, and simultaneously all switches of the upper half-bridge or all switches of the lower half-bridge are closed. This measurement of insulation defects by way of current sensors may only be used for the hard earth fault in a TN-network (Terre Neutre network). However, given an insulation defect, only very small fault currents determined by the measurement circuit occur in an IT-network, so that these fault currents are orders of magnitude smaller than the currents occurring in normal operation, so that this idea is of no relevance with regard to IT-networks.

EP 1 336 528 A2 shows a detection of ground errors by coupling out the voltage of a branch of an intermediate circuit (or DC link) by means of a capacitance and a voltage divider, rectifying the voltage, filtering it and inputting it to a comparator. In other variants, the branch voltage is captured over a measurement transformer, or the current through a grounding capacitor (C3) is measured. In each case it thus only possible to detect the presence of an alternating voltage, as it may occur due to a ground error on a branch. Thus, there is no measurement of the branch voltage between the branches, and there further only is a filtered measurement, that is, a measurement that does not provide an actual, momentary value of the branch voltage. The operating condition of the inverter is not considered.

U.S. Pat. No. 5,686,839 shows a method for detecting ground errors which is executed when the motor is not powered. Dedicated measurement resistors (that is, they are not required for normal operation of the converter) are arranged between the electrical ground and the intermediate circuit branches. A ground fault causes the potential of the intermediate circuit to be defined with respect to ground, and a ground fault current flows through at least one of the measurement resistors, so that the voltage measured across these resistors indicates a ground fault. In order to drive this current, for example, all the upper or all the lower switches of the inverter are closed. In another variant, all six switches are opened and closed individually. The difference of measurement voltages can be used for the fault detection, but it is only possible to detect ohmic ground faults. Detecting faults during operation of the inverter is considered to be disadvantageous.

JP 2000 116144 aims to detect a ground fault during operation of an inverter, and is based on the measurement of the current through the intermediate circuit. Furthermore, circuitry is required which detects a particular state of the inverter, in which all the switches of a half-bridge of the inverter are closed, i.e. in a conducting state.

SUMMARY OF THE INVENTION

It is therefore desirable to provide a method and a device for the insulation monitoring for inverter applications of the initially mentioned type, which are less prone to disturbance.

The method is thus applied for monitoring an inverter application, wherein the inverter application comprises:
  a intermediate voltage circuit (or DC link) with at least one positive branch and a negative branch;

at least one electrical apparatus which comprises at least two phase connections;

at least one inverter with switch elements for the electrical connection of the phase connections to the positive branch or the negative branch of the intermediate voltage circuit;

The method comprises the steps of:

determining an operating condition of the inverter;

measuring at least one of a voltage of the positive branch and a voltage of the negative branch;

determining insulation defects at the intermediate voltage circuit and/or at the phase connections and/or at the electrical apparatus in accordance with the measured voltages and the operating condition of the inverter.

The inverter application comprises at least one apparatus fed by an inverter, but may also have several apparatus which are fed by the same inverter, as well as several inverters at the same intermediate circuit. The apparatus are preferably electrical drives such as asynchronous machines or synchronous machines, but may however also be other consumers or power sources such as heaters, transformers, batteries, welding installations or (solar) generators, etc. The consumers may be fed in a two-phase, three-phase or poly-phase manner.

In one embodiment, determining insulation defects is based on a difference of part voltages (or partial voltages) of the intermediate circuit, this difference hereinafter being called "differential voltage". Thus the monitoring of the insulation is carried out only with the means which are present in the inverter in any case, in particular by way of the measurements of the intermediate circuit voltage, which is required for the closed-loop control of the inverter, and by way of the operating condition which is set by the closed-loop control of the inverter. No additional measurement devices are used for the insulation monitoring, or measurement devices which are only used for the insulation monitoring. On account of this, there is no danger of additional faults, as may arise with the state of the art on account of the additional measurement devices or measurement signal feeds.

In place of the differential voltage, one may use all other variables (also to be called "voltage functions") which are mathematically essentially equivalent and are derived from the part voltages in another manner. These variables contain the same information. For example, the intermediate circuit voltage is known, if for example it is controlled with a closed-loop to a constant value by way of its power feed, typically a battery or a rectifier. Thus, the second part voltage may be computed from the one part voltage and the intermediate circuit voltage, and from this, in turn the differential voltage. Thus the complete information of the two part voltages is also contained in the knowledge with regard to the (predefined) intermediate circuit voltage and one of the part voltages. For this reason, one may for example also use the ratio of one of the part voltages to the intermediate circuit voltage instead of the differential voltage. If the intermediate circuit voltage is constant, then alternatively, one of the part voltages alone may also be used.

The monitoring device according to the invention thus knows the operating condition of the inverter and/or may set the operating condition itself. With this, it is possible to deal with the current (actually present) condition in a much more targeted manner. On the one hand, one may thus detect any occurring faults in a more locally precise manner, and on the other hand threshold values, which when exceeded trigger a fault notice, may be adapted to the operating condition. In particular, on measuring the capacitive fault currents which are inherent of the system, one may take account of the condition of the drive or drives or their individual inverters, and warning limits and error limits may be fixed in a more precise manner.

In one exemplary variant of the invention, the step of determining insulation defects thus comprises the following part steps:

acquiring values of characterizing variables of the differential voltage (or an equivalent quantity) of the intermediate circuit;

comparison of the detected values with reference values, and, if a deviation from the reference values exceeds a predefined limit, signaling the presence of an insulation fault.

The mentioned characterizing variables in one example are a temporal course of the differential voltage, or values of further variables which characterise this temporal course. Such further characterizing variables are for example a time until exceeding a predefined threshold value, a rise time, a time constant of a transient procedure, a sequence of values of the function, a transient time or settling time, a stationary end-value, an integral, a value of the function at a predetermined time after switching the switches according to the testing configuration, etc. In an exemplary embodiment of the invention, from a value of such a variable a value corresponding to the magnitude of a capacitive ground fault is computed. For example, larger time constants correspond to a larger fault capacity.

In another exemplary embodiment of the invention, characterizing variables are derived from an analysis of the differential voltage in the frequency domain. These in particular are amplitudes or energy components of the differential voltage in a certain frequency range, thus after filtering.

Analogously thereto, reference values are values of characterizing variables which are preferably acquired experimentally in a teach-in phase, on starting operation (i.e. commissioning) of the inverter device, and represent a nominal condition with a good insulation.

Basically any exceeding of a threshold value may lead to the assumption that an insulation defect is present. As to how one reacts to this assumption, depends on the circumstances and on the type of suspected fault. An assumption may directly trigger an alarm or a warning notice, but may also be processed together with further indicators, so that for example a confirmation by way of measurements with methods according to other variants of the invention or at a different point in time or in a different operating condition is required, in order to substantiate an assumption and to trigger an alarm.

Furthermore, a temporary increase of the capacitive fault currents caused by an extreme situation (moisture and/or contamination) may be made visible by way of a warning. After eliminating the cause (drying/cleaning), the absence of the warning indicates that this elimination has been carried out in a successful manner.

The evaluation of characteristic variables of the differential voltage is, according to different embodiments of the invention, preferably effected in that:

in an initialization phase or test phase, the switches are activated according to a setting of the insulation measurement device, and the differential voltage is analyzed in the time domain; or in an operational phase, the switches are controlled by the conventional inverter closed-loop control, and the differential voltage is analyzed in the frequency domain, whereby information on the operating condition of the inverter closed-loop control is preferably also used.

In a first exemplary variant of the invention therefore, switch positions of the inverter are set, and the switches of the inverter, typically power semiconductors, are switched in accordance with this setting, for determining the operating condition. The operating condition of the inverter in this variant is characterized by switch positions of its switch elements. It is possible by way of the inclusion of these power switches present in the inverters, to assign the location of the insulation fault to part networks, and thus to provide exact indications with regard to the apparatus or wiring to be replaced. This is preferably not done during normal operation of the inverter and the connected drive or apparatus, but in an initialization phase or test phase on starting the apparatus, with the drive in standstill.

Thus the monitoring device may be integrated into an inverter controller. Thus preferably no further physical components are required in comparison to an existing frequency converter controller, in particular no active means whatsoever for injecting measurement signals, and apart from the intermediate circuit measurement required anyway for a modern closed-loop control of the drive, also no further physical measurement devices are required. In the case of a microprocessor controlled closed-loop control of the inverter, only its software is to be expanded, in order to realise the method for insulation monitoring.

For example, in a further exemplary variant of the invention, individual or all switches of a half-bridge are switched on (closed), whilst the switches on the opposite half-bridge remain open, thus non-conducting. One or several or all phase connections are connected only to one branch of the intermediate circuit by way of this, and remaining (none as the case may be) phase connections are not connected to the opposite branch. Thus—inasmuch as no ohmic insulation fault is present—no continuous current may flow into the apparatus. However, in a transient phase, a transfer of charge in the capacitances of the leads and the apparatus takes place, so that information with regard to these capacitances can be deduced from the resulting brief collapses of the intermediate circuit voltages, which are particularly visible in the differential voltage. In the case of ohmic insulation faults, the voltage level of the complete intermediate circuit shifts, which leads to a stationary shifting of the differential voltage as long as the half-bridge is connected through.

Insulation faults in an apparatus or it supply lead may be measured by way of this. In the case that several inverters are connected at the same intermediate circuit, this may be carried out in a sequential manner with each individual inverter, in order to determine the insulation quality of the respective assigned apparatus or its supply lead.

In a further exemplary variant of the invention—after the stationary condition has been reached again, wherein all switches are opened—this procedure is repeated for the opposite half-bridge, so that a charge transfer take place in the reverse direction. An asymmetry between the two charge transfer procedures indicates an asymmetry of the intermediate circuit voltage measurements, and thus may be used for testing the intermediate circuit voltage measurement itself. The asymmetry is also exhibited if the values of the two oppositely poled measurements are compared to one another, without taking the polarity into account, for example by taking the difference of the absolute values of the two measurements.

In a further exemplary variant of the invention, the following steps are carried out:
  simultaneous and brief switching-on of several switches for the connection of at least one of the phase connections to a first branch, and at least another of the phase connections to a second branch of the inverter;
  measurement of at least one current through one of the thus connected phase connections during the switching-on;
  ascertaining as to whether at least one connection of the phase connection to the apparatus is interrupted, in accordance with the at least one current measurement.

With this, additionally to the insulation monitoring, one may also carry out a check of the interconnectedness of the apparatus connections, without further measurement means being required, than are already present anyway in a modern drive control. In this case, current sensors for measuring the current in the phase connections, thus through the apparatus connections, are used. As a rule, such current sensors (at least two) are provided anyway with a three-phase drive. Basically, this variant for determining whether a connection to the apparatus is interrupted, may also be implemented independently of the insulation monitoring.

In a second exemplary embodiment of the invention, the step of determining the operating condition comprises:
  acquiring parameters of the inverter control during normal operation (in contrast to a testing condition) of the inverter and the apparatus being powered;
  wherein these parameters include at least one of the output frequency and modulation frequency, and optionally also the output voltage and/or the output current of the inverter.

The output frequency and the output voltage are also called stator frequency and stator voltage in drive technology, and hereinafter are applied in an interchanging manner. The output frequency is typically equal to the frequency of the smoothed, pulse-modulated output voltage (basic harmonic). This base frequency is modulated up to a higher (PWM) modulation frequency. The output voltages of the three-phase connections are controlled to the same voltage and frequency, and differ only in their phase.

The method according to this variant is preferably carried out in an operational phase in normal operation of the inverter or of the apparatus. The operating condition of the inverter is therefore in particular characterised by the output frequency and/or by the modulation frequency of the inverter. These frequency components of the inverter voltage also lead to corresponding currents through parasitic capacitances and fault capacitances and with this, to changes in both part voltage measurements, so that the change of the insulation fault impedances may be determined by way of the change of these part voltages, in particular the differential voltage.

The measured intermediate circuit voltages, by way of the known output frequency and/or the modulation frequency, are analysed especially with respect to changes or disturbances in these frequency ranges. Thus for this, on filtering the intermediate circuit voltages or signals derived therefrom (also called voltage functions), filter settings are chosen, depending on the current operating condition of the drive.

Thus disturbances in other frequency ranges, which do not originate from insulation faults, are eliminated. With this, again threshold values may be set more precisely for recognising fault conditions. Moreover, disturbances, in dependence on the frequency concerned, may be assigned to that inverter which momentarily operates with this frequency. This is in contrast to the state of the art, according to which the signals are processed by way of low-pass filters with very large time constants, which leads to long response times.

By way of the fact that the insulation measurement also uses the already present measurement device of the intermediate circuit voltage, one ensures that this functions in a correct manner. It is above all in modern drives that the intermediate circuit voltage measurement has a decisive task, since this measurement significantly influences the quality of the closed-loop control of the drive. A smaller deviation already leads to disturbances of the drive, so that a creeping increase of a measurement error becomes noticeable in the closed-loop control, before the insulation measurement gives false results.

In a further exemplary variant of the subject-matter of the invention therefore, the measurement of the intermediate circuit voltage is monitored by way of the behavior of the closed-loop control of the drive, and a self-monitoring of the voltage measurement is realised in this manner. In the case that the closed-loop control of the drive functions in a correct manner (thus for example voltages and currents do not catch) it is assumed that the measurements of the branch voltages likewise function correctly.

A method for manufacturing a monitoring apparatus for insulation monitoring for inverter applications comprises the following steps:
- providing a data processing unit and a memory unit of the monitoring apparatus, as well as measurement inputs or communication means for acquiring readings and their transfer to the data processing unit;
- storing a program code in a memory unit of the monitoring apparatus;
- wherein the program code on its implementation, brings the data processing unit to carry out the method described above.

Further exemplary embodiments are to be deduced from the dependent patent claims. Thereby, features of the method claims with regard to their context may be combined with device claims and vice versa.

BRIEF DESCRIPTION OF THE DRAWINGS

The subject-matter of the invention is explained in more detail by way of an exemplary embodiment, examples which are represented in the accompanying drawing. In each case there are shown schematically in:

FIG. 4 an inverter arrangement with inverter controls which have been drawn in.

The reference numerals used in the drawings and their significance are listed in the listed in the list of reference numerals. Basically, the same parts are provided with the same reference numerals in the figures.

DETAILED DESCRIPTION

Figure 1:
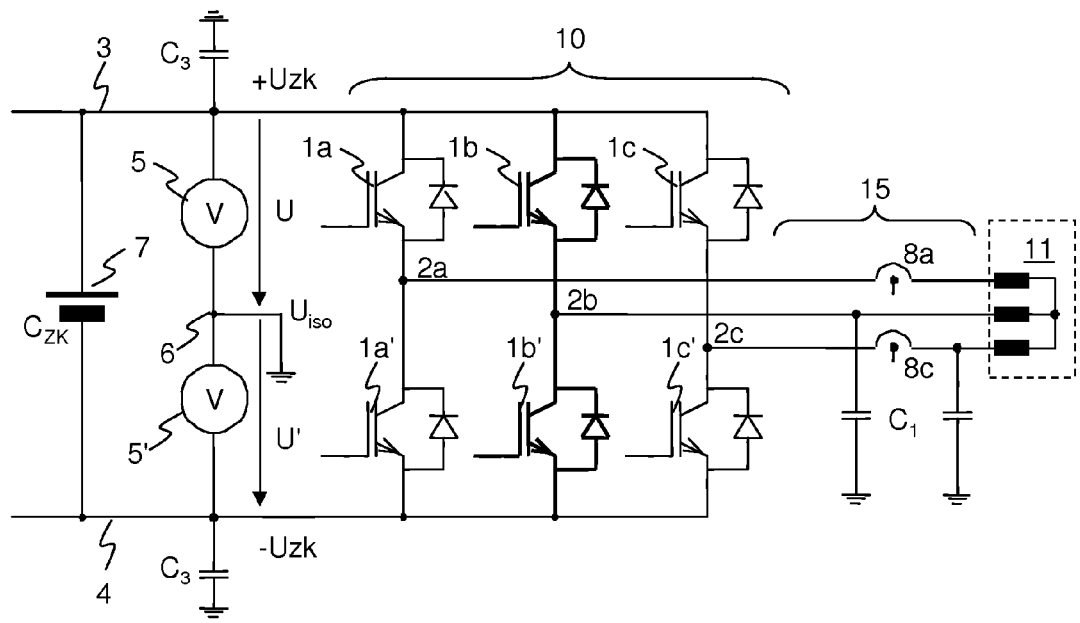
FIG. 1 an inverter arrangement.

FIG. 1 shows an inverter arrangement. An intermediate circuit 7 with an intermediate circuit (or CD link) capacitance $C_{ZK}$ is fed by a source (not shown), for example an active or passive rectifier (directly or via a direct current network) or a battery, which may be connected directly or via a DC voltage controller. A rectifier is typically fed by a transformer or a generator. A neutral point 6 of the intermediate circuit 7 is electrically connected to earth, a vehicle chassis and/or to housing parts of the apparatus in the IT network. The intermediate circuit 7 comprises a positive branch 3 whose voltage $+U_{ZK}$ with respect to the neutral point 6 may be measured by a first branch voltage measurement 5, and a negative branch 4 whose voltage $-U_{ZK}$ may be measured by a second branch voltage measurement 5'. An inverter 10 is formed in the known manner by way of electronic power switches, which collectively are indicated with the reference numeral 1. A first group of these switches 1 with the reference numerals 1a, 1b, 1c forms an upper half-bridge, a second group 1a', 1b', 1c' forms a lower half-bridge. The switches 1 connect phase connections 2a, 2b, 2c (collectively indicated with the reference numeral, 2) selectively to the positive branch 3 or the negative branch 4. By way of a pulse width modulation for example, in the known manner then, the voltages Ua, Ub, Uc are controlled at the phase connections. IGBTs (insulated gate bipolar transistor) are drawn in the FIG. 1 as switches 1, but the invention however may be realised independently of the switch type, for example also with MOSFETs, GTOs, thyristors, etc.

A drive 11, or generally an apparatus 11 with apparatus impedances Xa, Xb, Xc, is connected to the phase connections 2 via a lead 15. In the following explanation one speaks of a drive 11, although the invention may basically be applied to connected apparatus of any type. The drive 11 or the leads 15 may have ammeters 8a, 8c for measuring the current through the phase connections 2.

Parasitic capacitances $C_1$ are drawn in at the conductors of the lead 15, and these represent lead capacitances and drive capacitances. Likewise, further capacitances $C_3$ are drawn in between the positive branch 3 or the negative branch 4, and the neutral point 6. These capacitances $C_3$ are either also of the parasitic type, or are capacitors which have been added on purpose. The mentioned capacitances $C_1, C_3$ contribute to the disturbance of conventional insulation testing methods.

The insulation defects are detected by way of a difference of part voltages of the intermediate circuit. Preferably, it is exclusively this difference which is used, so that no further measurement devices are required. The part voltages on the one hand are the voltage U between the neutral point 6 and the positive branch 3, and on the other hand the voltage U' between the negative branch 4 and the neutral point 6. In the nominal condition, the difference Ud=U−U' of these two voltages is zero. Their sum U+U' is the same as the intermediate circuit voltage Uzk in each condition.

The explanation is effected hereinafter according to the differential voltage. Basically however, the analysis may be carried out in an analogous manner from other derived signals, which come from an individual part voltage or a combination of the part voltages. I.e. that e.g. stationary end values, time constants of transient procedures and analyses in the frequency domain from such derived signals, may likewise be used by way of their temporal change and by way of comparison with reference values, for the detection of insulation faults and/or errors in the acquision of measurement values.

In an exemplary variant of the invention, for determining insulation faults, switch positions or switch configurations of the inverter 10 are set, and the switch 1 of the inverter 10 is activated in accordance with this setting.

Figure 2:
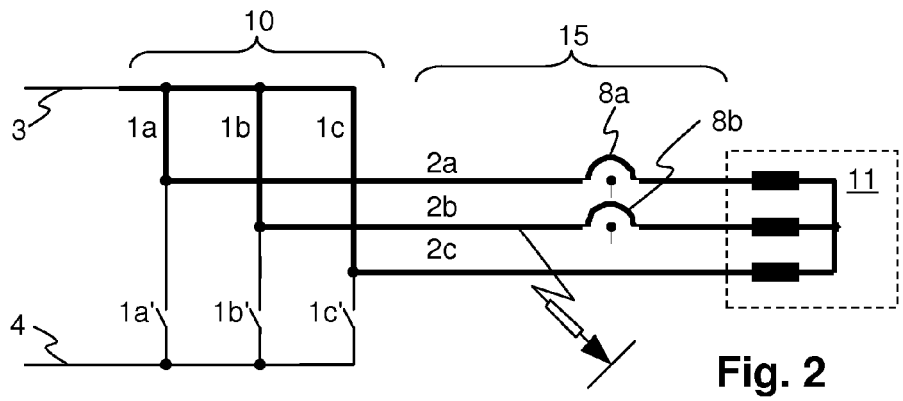
FIG. 2 a switch configuration for insulation measurement.

FIG. 2 shows such a switch configuration for insulation measurement. All phase connections 2 are simultaneously connected to the positive branch 3 by respective switches 1a, 1b, and 1c of the upper half-bridge. Expressed generally, thereby the following happens:

in a first test configuration, a simultaneous switching-on of one or more switches for the connection of only a first (thus only the positive or only the negative) branch 3; 4 of the inverter to one or more phase connections 2, wherein the second, opposite (thus the negative or the positive) branch 4; 3 is not connected to the phase connections 2.

If an insulation error occurs, the sum voltage then remains essentially constant, the voltage level of the positive branch 3 and of the negative branch 4 however shifts with respect to the neutral point 6, and a differential voltage different from zero arises.

Figure 3:
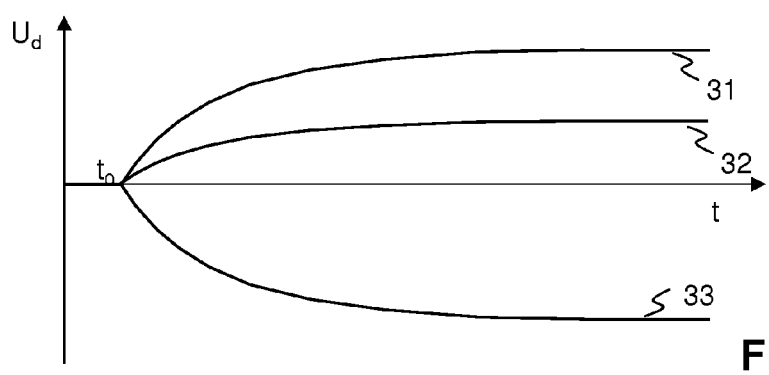
FIG. 3 trajectories of differential voltages with the insulation measurement.

FIG. 3 thereby shows resulting trajectories of differential voltages Ud=U−U' against time t after switching on the switch 1 at the point in time $t_0$. The differential voltage would remain zero in the ideal case without any insulation faults. A first trajectory 31 and a second trajectory 32 correspond to differently large insulation faults on switching on the upper switches 1a, 1b, 1c for example. An insulation fault may for example be assumed, if the stationary end-value or the value of the differential voltage exceeds a predefined reference value after a predefined time. The stationary end-value is primarily a function of an ohmic insulation fault. An insulation fault is assumed if a predefined reference value is exceeded. If this stationary end-value rises too quickly in the course of time, thus with several tests which are repeated in temporal intervals, they an insulation fault may likewise be assumed.

One may likewise deduce the insulation quality from the time constants of the trajectories. If the time constant increases in the course of time (thus over minutes to days), then an increase of the parasitic capacitances is assumed, When the time constant exceeds a reference value, a capacitive insulation fault is assumed to be present. Thus, the time constant is a measure for the magnitude of a capacitive ground fault. Instead of the time constant, preferably other variables which also characterize the temporal course or trajectory of the function (and not only one momentary value) are evaluated. Such variables are, for example, a sequence of values of the function at predetermined sample times, an integral of the function over a predetermined time span, or a value of the function at a given time after switching the switches according to the testing configuration.

As to how the characteristic values are interpreted and brought into a relationship with one another, depends on the respective conditions of an installation, in particular on the relative and absolute dimensions of the leads, apparatus, voltage levels, currents etc. Similar courses also occur with other voltage functions.

The third trajectory 33 is the exemplary result, if, in a second test configuration, only the negative branch 4 is connected via lower switches 1a', 1b', 1c' to the phase connections 2. In the case that the second trajectory 32 originates from the same installation but when switching on the upper switches, then the third trajectory 33 would have to run symmetrically to the second trajectory 32. If this is not the case, that is, the voltage functions are asymmetric with respect to one another, an error in the voltage measurement is assumed when a certain maximum deviation from symmetry exceeded. For example, a deviation of the absolute magnitudes of the stationary end values or the integrals of the trajectories 32, 33 may serve as a measure for the deviation.

In principle, a differentiated analysis of the insulation of the individual leads is possible by connecting, of the phase connections 2, only individual ones to a branch.

Figure 4:
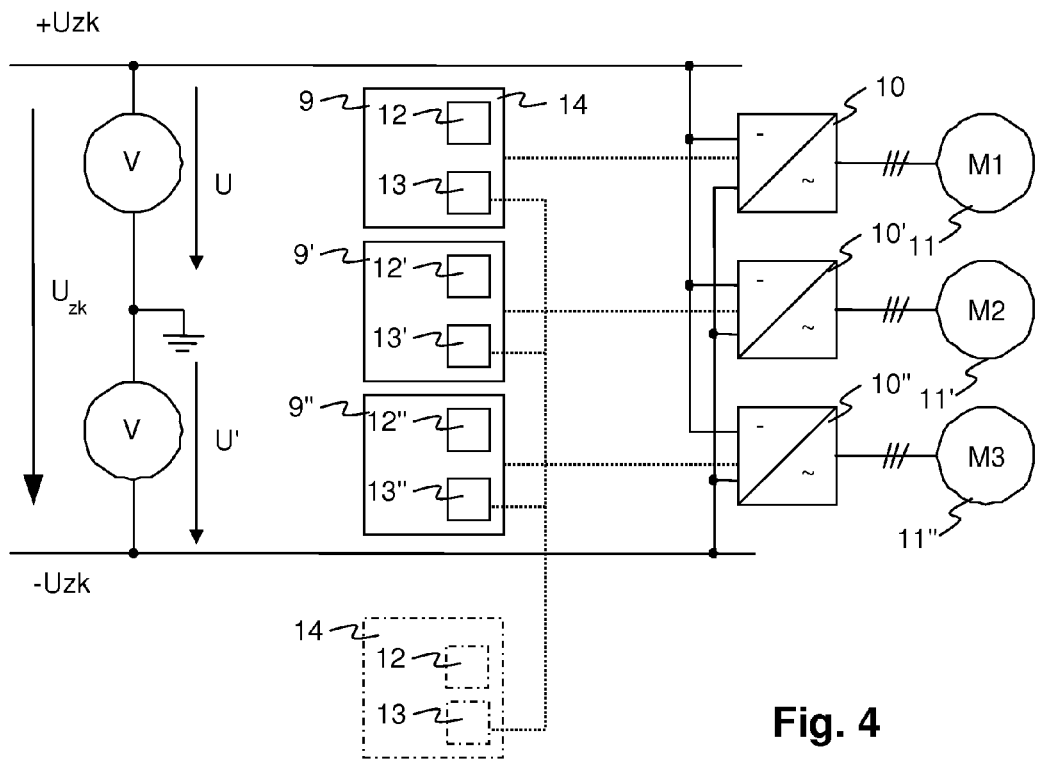

FIG. 4 shows an inverter arrangement with inverter controllers drawn in. Several inverters 10, 10', 10" in each case with assigned apparatus or drives 11, 11', 11", are connected at the same intermediate circuit 7 (the link capacitance being omitted in the drawing). An inverter controller 9, 9', 9" is assigned to each of the inverters 10, 10', 10". From the control technology point of view, the inverter controllers 9, 9', 9" are separate entities, even if, in reality, they may be implemented on a common hardware unit. By way of example and for the following explanation, it is assumed that each of the inverter controls 9, 9', 9" has its own data processing unit 12, 12', 12". Furthermore, each of the inverter controls 9, 9', 9"—depending on the type of assigned apparatus or drive 11, 11', 11'—may have measurement means. These measurement means are:

measurement devices for the intermediate circuit voltages, currents through the phase connections 2, rotational speeds and other apparatus variables, or communication means 13 such as field buses, which are set up for receiving such measurement variables. The transfer of the measurement signals or the control signals is indicated by dashed lines.

An insulation monitoring device 14 may be designed as a separate unit (drawn in a dot-dashed manner), or as part of one of the inverter controls 9, 9', 9". Preferably, the insulation monitoring device 14 also comprises communication devices 13 for receiving operating parameters of other inverter controllers 9, 9', 9".

The method described above, with which only one of the inverter branches 3, 4 is connected to a drive 11, is carried out in a configuration according to FIG. 4, one after the other for each of the inverters 10, 10' 10" or drives 11, 11', 11". Thus the mentioned first and possibly also the second test configuration, in each case is set separately by precisely one of the several inverters 10, 10', 10", wherein the other inverters 10, 10' 10" remain switched off. With this, one may deduce in which apparatus 11, 11', 11', or at which phase connections an insulation fault is present. For this, the inverter controls 9, 9', 9" may be activated in each case by the insulation monitoring device 14 via the communication devices 13, 13', 13" for switching the test configurations. The communication devices 13, 13', 13" thus here function as control means.

Figure 5:
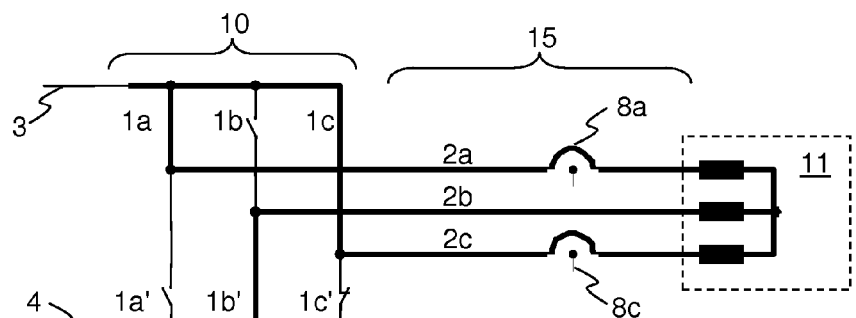
FIG. 5 a switch configuration for determining the interconnectedness.

FIG. 5 shows a switch configuration for the control of the interconnectedness of the apparatus connections. At least one phase connection 2a, 2c is switched to the positive branch 3, and at least one further phase connection 2b is switched to the negative branch 4. The interconnectedness of the connections is deduced using current measurements 8a, 8b which are often present anyway with a drive control. In the shown example, two phase connections 2a, 2c are connected to the one, and the remaining phase connection 2b to the other branch. The remaining phase connection thereby is that one which does not have a current measurement (one redundant measurement is omitted for reasons of cost). If one of the two measured currents is zero, then the respective phase connection 2a or 2c is interrupted, if both are zero, the remaining phase connection 2b is interrupted.

If, a priori, it is not known which of the phase connections 2 is without current measurement, all three possible switch configurations with "two switches in the top half of inverter closed—one switch in the bottom half of inverter closed" are tested. If a current is measured in each case in both measurements 8a, 8c, then all phase connections 2 or leads 15 are interconnected.

By changing the switch configuration it is possible to detect and localize short circuits between powered leads 15. If only one switch configuration is tested, a short circuit between two leads 15 connected to the same branch 3, 4 cannot be detected, except for the case when the leads 15 are powered by means of PWM (Pulse Width Modulation) with different voltages, and the analysis of the resulting current in the corresponding branch 3, 4 takes this into account.

It may be important for the protection of persons and equipment to detect the interruption of leads 15 and/or such short circuits. For example, if the short circuit detection as described above is performed with a reduced intermediate voltage, e.g., when charging the DC link capacitor, then the semiconductor switches will not suffer any damage, even if they cannot survive a higher short circuit current, as it would be caused by the full intermediate circuit voltage.

In an exemplary embodiment of the invention, the following steps are performed for this detection of short circuits between leads:

Charging or discharging the intermediate circuit up or down to a reduced intermediate voltage, or, alternatively, charging it to the full (nominal) intermediate circuit voltage.

Briefly applying different voltages to at least two phase connections 2a, 2b, 2c by means of the inverter switches 1. This can be done by means of unmodulated connecting or by modulating a voltage. The time the voltage is applied is preferably less than 50, in particular less than 5 milliseconds.

Evaluating at least one resulting current and/or evaluating the triggering of a short circuit detector. A short circuit detector may be implemented by, e.g. current sensors in the phase connections or in the inverter branches, or by monitoring a voltage across the switches: under normal conditions, without a short circuit, the (collector-emitter) voltage across a closed switch would not exceed a certain value.

Determining, according to the results of this evaluation, whether there is a short circuit between at least two of the phase connections 2a, 2b, 2c.

The last three steps preferably are repeated with other voltages being applied, if otherwise a short circuit can't be detected in a reliable manner. The above steps for detecting the presence of a short circuit between leads 15 or phase connectors 2a, 2b, 2c can also be performed independently from the other methods described in this patent application.

Figure 6:
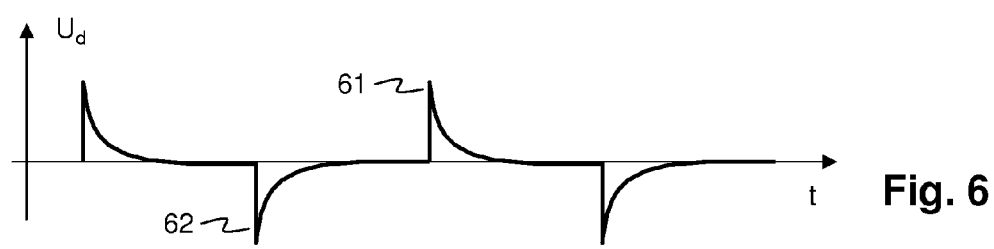
FIG. 6 a course of a differential voltage.

FIG. 6 shows a course of a differential voltage in the time domain during the operation of an inverter 10. Each switching of a phase connection 2 from one to the other branch leads to a spike-like, and then decaying positive 61 or negative peak 62. The distance of successive peaks is a function of the modulation frequency of the inverter, its height, and the decay time is a function of the capacitances in leads 15 and drives 11. The peaks superimpose accordingly with the presence of several inverters 10, 10', 10".

In an exemplary embodiment of the invention, a self-test of the insulation monitoring or the device 14 is performed as follows: If it is known, e.g., in a testing condition, that no leads 15 are connected, then no cable capacitances are effective and the peaks should be much smaller than when a lead 15 is connected. Thus, a measure for the size of the peaks is generated, that is, a measure for the transient deviation of the function from a reference value. This is, for example, a characteristic value such as an amplitude of the peak, an integral of absolute values, an RMS value, etc., each being either filtered or unfiltered. If this measure, under this test condition, exceeds a predetermined magnitude, it is assumed that an error exists in the insulation monitoring system itself, in particular in the measurement acquisition part.

Figure 7:
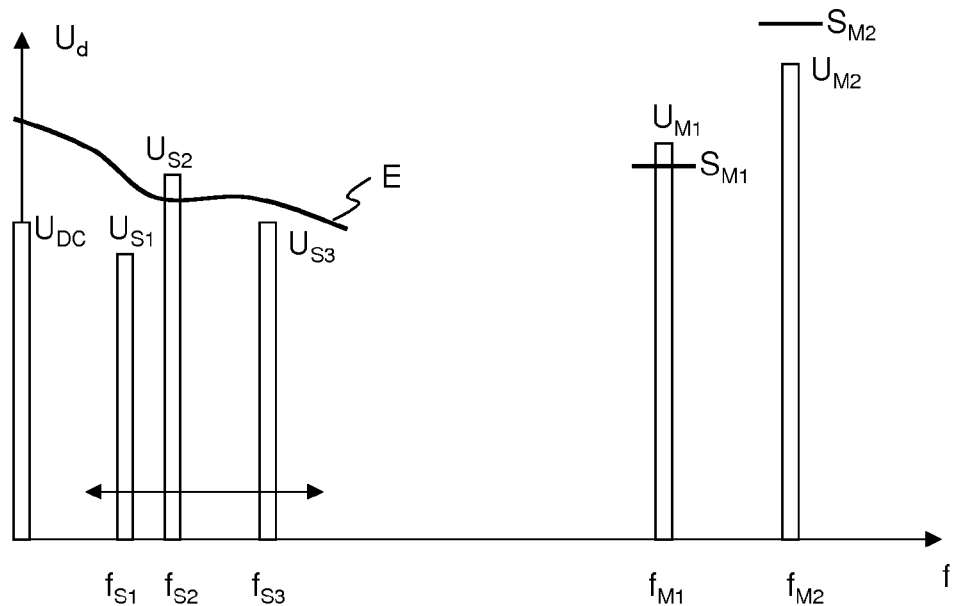
FIG. 7 a frequency spectrum of a differential voltage course.

FIG. 7 shows a frequency spectrum of a differential voltage course. Drawn in schematically are:

$U_{M1}$, $U_{M2}$, spectral components corresponding to a first and a second modulation frequency $f_{M1}$, $f_{M2}$;

$S_{M1}$, $S_{M2}$: reference values assigned to the modulation frequencies;

$U_{S1}$, $U_{S2}$, $U_{S3}$: spectral components corresponding to different output frequencies $f_{S1}$, $f_{S2}$, $f_{S3}$, wherein a variability of the output frequencies is indicated by a double arrow;

E: an envelope of reference values for the stator frequencies; and

UDC: a d.c. signal component of the differential voltage.

An actually measured spectrum comprises further frequency components, which may originate from any type of disturbances, and may adulterate the results in a conventional insulation monitoring. For this reason, the differential voltage signal is filtered by way of the information from the one or more inverter controls 9, 9', 9", and apart from the d.c. signal component $U_{DC}$, preferably only the signal components in the range of the modulation frequencies and/or the output frequencies are considered. With regard to these signal components, it is known that they are produced by the inverter or inverters, and for this reason have a relation to the intermediate circuit voltage and to the insulation characteristics of the connected apparatus. Other voltage functions such as an individual part voltage for example, a ratio of part voltages, a ratio of a part voltage to the total voltage, etc. in principle have similar spectral components as in FIG. 7, and thus, in the same manner, may be analysed in a targeted manner by way of such a filtering.

Modulation frequencies typically lie in the kHz range, e.g. around 6 to 8 kHz. Stator frequencies with drives typically lie between zero and 1000 Hz. Band-pass filters, preferably realised in software, are for example used for determining the respective signal components, the mid-frequencies of these being filters equal to the respective stator frequency or modulation frequency. The modulation frequencies and/or stator frequencies are preferably transmitted to the insulation monitoring device 14 from the inverter controllers 9, e.g., over a field bus. Alternatively or additionally, these frequencies can, for one, several or all of the drives 11, be determined by analyzing the intermediate circuit voltage(s) in the frequency domain, for example by an FFT (Fast Fourier Transform), which determines signal components at different frequencies. This allows to track a signal component having a varying frequency in real time, and to determine its deviation from reference values.

The reference values $S_{M1}$, $S_{M2}$, E are furthermore directed individually to the applied drives 11, 11', 11". For this, by way of theoretical settings, or preferably in a teach-in phase, the frequency components of a drive are measured at the one or more modulation frequencies and one or more output frequencies, provided on operation. In each case, a value which is larger by a set factor is selected as a reference value. With drives with continuously varying stator frequencies, the quantity of separate reference values results in the reference value envelope E. Basically, each drive may have its own reference value envelope E, but for simplification, a common reference value envelope E may also be defined.

Thus the signal component is thus computed at its current output frequency for each of the drives 11, 11', 11", and is compared to its reference value envelope E. An insulation fault is assumed if this reference value envelope E is exceeded. The same is effected for the signal components at the modulation frequencies, wherein these as a rule are not changing. An exceeding of the reference value $S_{M1}$ is drawn in as an example at $f_{M1}$.

Thereby, one takes into account the fact that two drives may for example temporarily have the same stator frequency, or operate permanently with the same modulation frequency. Their signal components thereby superimpose in the frequency region. For this reason, in the case that two or more of the connected inverter controls 9, 9', 9" report the same stator frequency, the insulation monitoring device 14 increases the reference value or the envelope at this frequency. The reference value for example may be increased to the sum of the reference values for the two drives at this frequency. Other mathematically equivalent methods are conceivable, but the basic principle that the information on the conditions of the inverter is taken into account on assessing the disturbance spectrum, remains. This analogously applies to the modulation frequencies and is drawn in the figure by way of example with the comparatively high reference value $S_{M2}$ at $f_{M2}$, wherein it is assumed that two of the three drives represented in FIG. 7 operate at the same modulation frequency $f_{M2}$.

Figure 8:
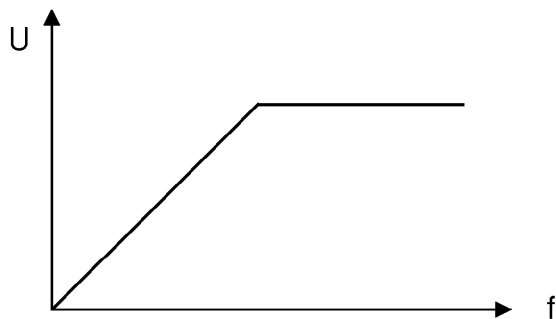
FIG. 8 a frequency-voltage characteristic line of a drive inverter.

Further characteristics of the inverter control 9 are taken into account in a further exemplary embodiment of the invention, for example a relation between the stator frequency and stator voltage used in drive technology. FIG. 8 qualitatively shows a common frequency-voltage characteristic line of a drive inverter. The frequency and voltage typically relate to the frequency and voltage amplitude of the fundamental frequency of the stator voltage. With the assessment of the signal spectrum, one also takes into account the fact that the stator voltage increases together with the frequency in a certain range. For this reason, preferably the signal component is normalised or scaled (depending on the approach) with respect to the voltage amplitude, for example by way of dividing the signal component by the voltage amplitude, before or after the filtering. Methods which are mathematically essentially equivalent may be applied to the signal energy, or by way of lifting reference values proportionally to the voltage amplitude.

Figure 9:
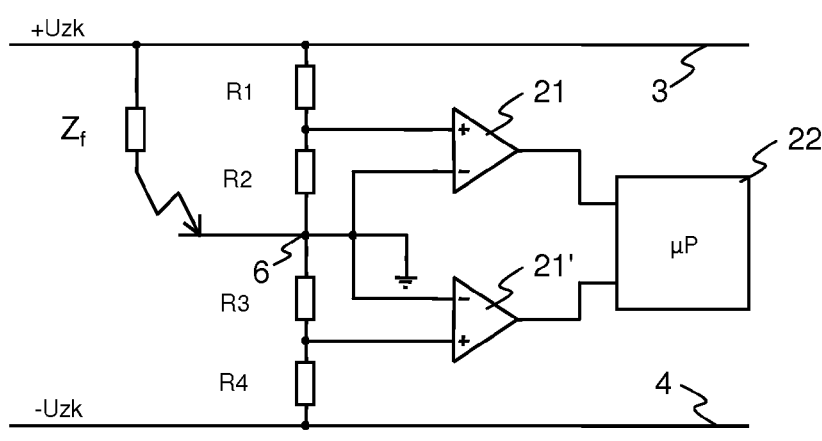
FIG. 9 a measurement arrangement for measuring intermediate circuit voltages.

FIG. 9 shows a measurement arrangement for the measurement of intermediate circuit voltages. Two measurement amplifiers 21, 21' amplify the voltage at the taps of voltage dividers R1/R2 and R3/R4 for acquiring the upper and the lower part voltage. A microprocessor 22 which may be identical to the data processing unit 12 of the insulation monitoring device 14, determines the intermediate circuit voltage as a sum of the part voltages for the inverter control for example, and the differential voltage for insulation monitoring. Alternatively, the summing or the difference formation may also be effected with analogous means. A fault impedance Zf is further drawn in, which illustrates that the symmetry of the voltages shifts with an insulation fault. As long as the power semiconductors are switched off, and no disturbances are present in the system, then one may determine the insulation quality of the intermediate circuit itself from the differential voltage. Possible insulation faults in the drive 11 or in the lead 15 are not visible in this condition, since the power semiconductors 1 do not conduct.

The invention has been explained in the described embodiments by way of two-point inverters, but analogously may just as well be applied to three-point inverters.

LIST OF REFERENCE NUMERALS

| | |
|---|---|
| 1a, 1b, 1c, 1a', 1b', 1c' | switches |
| 2a, 2b, 2c | phase connections |
| 3 | positive branch |
| 4 | negative branch |

LIST OF REFERENCE NUMERALS -continued

| | |
|---|---|
| 5, 5' | branch voltage measurement |
| 6 | neutral point, earth, PE or vehicle chassis |
| 7 | intermediate circuit |
| 8a, 8b, 8c | ammeter |
| 9, 9', 9" | inverter controller |
| 10, 10' 10" | inverter |
| 11, 11', 11" | apparatus, drive |
| 12 | data processing unit |
| 13 | communication connection |
| 14 | insulation monitoring device |
| 15 | lead, cable |
| 21, 21' | measurement amplifier |
| 22 | reading processing unit, microprocessor |
| 31, 32, 33 | trajectories of differential voltages |
| 61, 62 | differential voltage peak |

The invention claimed is:

1. A method for insulation monitoring in an inverter application, in a test phase of the inverter application wherein the inverter application comprises an intermediate voltage circuit with at least one positive branch and a negative branch;

at least one electrical apparatus which comprises at least two phase connections;

at least one inverter with switch elements for the electrical connection of the phase connections to the positive branch or the negative branch of the intermediate voltage circuit;

and wherein the method comprises the following steps:

in a first test configuration, simultaneously switching-on of one or more switches for connecting only a first branch of the inverter to one or more phase connections, wherein the second, opposite branch is not connected to the phase connections;

measuring at least one of
a voltage of the positive branch and
a voltage of a negative branch;

determining values of characterizing variables of a function of at least one of these measured voltages;

determining insulation defects at the intermediate voltage circuit and/or at the phase connections and/or at the electrical apparatus by comparing these characterizing variables with corresponding reference values, and, if a deviation from the reference values exceeds a predetermined limit, signaling the presence of an insulation defect.

2. The method according to claim 1, wherein the function of the at least one measured voltage is a difference of part voltages, or the ratio of a part voltage to the total voltage of the intermediate circuit, or an individual part voltage.

3. The method according to claim 1, wherein the step of determining characterizing variables of said function comprises:

computing a value which characterizes a temporal course of the function.

4. The method according to claim 3, wherein the value which characterizes the temporal course of the function is
a time constant; or
a sequence of values of the function; or
a settling time; or
an integral of the function; or
a value of the function at a predetermined time after switching the switches according to the testing configuration.

5. The method according to claim 3, with the further step of:

computing, from the value which characterizes the temporal course of the function, a value corresponding to a magnitude of a capacitive ground fault.

6. The method according to claim 1, with the further step, for the self-test of the insulation monitoring:
in a second test configuration, simultaneously switching-on of one or more switches for connecting only the second branch of the inverter to one or more phase connections, wherein the first branch is not connected to the phase connections;
measuring part voltages from the first and the second test configuration, and comparing functions of the part voltages from the first and the second test configuration, and in the case that the functions from the two test configuration are asymmetric with respect to one another, signaling the presence of an error in the measurements of branch voltages.

7. The method according to claim 6,
wherein the intermediate voltage circuit comprises a neutral point;
wherein the part voltages comprise the voltage between the neutral point and the positive branch, and the voltage between the negative branch and the neutral point; and
wherein the comparing of the functions is accomplished by comparing characterizing values of functions of part voltages from the first and the second test configuration, and in the case that the deviation of these values exceeds a predetermined value, signaling the presence of an error in the measurements of branch voltages.

8. The method according to claim 7, wherein the characterizing value of the functions of part voltages considered is an absolute value of a stationary end value or a value after a predetermined time or an integral of the respective function.

9. The method according to claim 2, with the further step, for a self-test of the insulation monitoring in an operating condition, in which the inverter is not connected to a lead:
signaling the presence of an error in the insulation monitoring if values of a characterizing value of the function of the at least one measured voltage exceed a predetermined limit.

10. The method according to claim 9, wherein the characterizing value is a measure of a transient deviation of the function from a reference value, and the function is a differential voltage.

11. The method according to claim 1, comprising the further steps:
simultaneous and brief switching-on of several switches for the connection of at least one of the phase connections to a first branch, and of at least one other of the phase connections to a second branch of the inverter;
measurement of at least one current through one of the thus connected phase connections during the switching-on;
ascertaining as to whether at least one connection of the phase connections to the apparatus is interrupted, in accordance with the at least one current measurement.

12. The method according to claim 11, wherein each of the phase connections is connected to the first or the second branch of the inverter, and wherein an interruption of a connection is indicated if at least one of the current measurements measures no current, and it is determined as to which connection(s) are interrupted, by way of comparison of the current measurements.

13. The method according to claim 1, comprising the further steps
charging or discharging the intermediate circuit up or down to a reduced intermediate voltage;
briefly applying different voltages to at least two phase connections by means of the inverter switches;
evaluating at least one resulting current and/or evaluating the triggering of a short circuit detector; and
determining, according to the results of this evaluation, whether there is a short circuit between at least two of the phase connections.

14. A device for insulation monitoring for inverter applications, wherein the inverter application comprises
a intermediate voltage circuit with at least one positive branch and a negative branch;
at least one electrical apparatus which comprises at least two phase connections;
at least one inverter with switch elements for the electrical connection of the phase connections to the positive branch or the negative branch of the intermediate voltage circuit;
and wherein the device comprises:
control means and data processing means configured to perform the steps of:
in a first test configuration, simultaneously switching-on of one or more switches for connecting only a first branch of the inverter to one or more phase connections, wherein the second, opposite branch is not connected to the phase connections;
measuring at least one of
a voltage of the positive branch and
a voltage of a negative branch;
determining values of characterizing variables of a function of at least one of these measured voltages;
determining insulation defects at the intermediate voltage circuit and/or at the phase connections and/or at the electrical apparatus by comparing these characterizing variables with corresponding reference values, and, if a deviation from the reference values exceeds a predetermined limit, signaling the presence of an insulation defect.

15. A device according to claim 14, wherein an intermediate circuit voltage measurement comprises two part voltage measurement devices, which measure a first part voltage between the positive branch and a neutral point, or a second part voltage between the neutral point and the negative branch; and wherein the data processing means is configured for determining insulation defects by way of a function of one or of both of the part voltages, wherein the function is a difference of the part voltages or a ratio of a part voltage to the total voltage of the intermediate circuit, or an individual part voltage.

16. A device according to claim 14, wherein the device is an integral component of an inverter control.

17. A method for manufacturing a monitoring apparatus for the insulation monitoring for inverter applications, comprising the steps of
preparing a data processing unit and a memory unit of the monitoring apparatus, as well as measurement inputs or communication means for acquiring readings, and their transfer to the data processing unit;
storing a program code in a memory unit of the monitoring apparatus;
wherein the program code, with its implementation, brings the data processing unit to carry out a method for insulation monitoring in an inverter application, comprising the following steps:
in a first test configuration, simultaneously switching-on of one or more switches for connecting only a first branch of the inverter to one or more phase connections, wherein the second, opposite branch is not connected to the phase connections;
measuring at least one of
  a voltage of the positive branch and
  a voltage of a negative branch;
determining values of characterizing variables of a function of at least one of these measured voltages;
determining insulation defects at the intermediate voltage circuit and/or at the phase connections and/or at the electrical apparatus by comparing these characterizing variables with corresponding reference values, and, if a deviation from the reference values exceeds a predetermined limit, signaling the presence of an insulation defect.

* * * * *